(12) United States Patent
Thakur et al.

(10) Patent No.: US 6,675,336 B1
(45) Date of Patent: Jan. 6, 2004

(54) DISTRIBUTED TEST ARCHITECTURE FOR MULTIPORT RAMS OR OTHER CIRCUITRY

(75) Inventors: Sangeeta Thakur, Sunnyvale, CA (US); Emad Hamadeh, Santa Clara, CA (US); Pidugu L. Narayana, Sunnyvale, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 526 days.

(21) Appl. No.: 09/592,700

(22) Filed: Jun. 13, 2000

(51) Int. Cl.[7] .................... G01R 31/28; G11C 29/00
(52) U.S. Cl. ............................ 714/733; 714/718
(58) Field of Search .......................... 714/733, 718

(56) References Cited

U.S. PATENT DOCUMENTS

| | | | | |
|---|---|---|---|---|
| 5,258,986 A | * | 11/1993 | Zerbe | 714/719 |
| 5,301,199 A | * | 4/1994 | Ikenaga et al. | 714/733 |
| 5,377,200 A | * | 12/1994 | Pedneau | 714/733 |
| 5,764,655 A | * | 6/1998 | Kirihata et al. | 714/733 |
| 5,796,745 A | * | 8/1998 | Adams et al. | 714/718 |
| 5,862,151 A | * | 1/1999 | Fagerness | 714/733 |
| 6,067,262 A | * | 5/2000 | Irrinki et al. | 365/201 |
| 6,216,241 B1 | * | 4/2001 | Fenstermaker et al. | 714/718 |
| 6,311,300 B1 | * | 10/2001 | Omura et al. | 714/724 |

* cited by examiner

Primary Examiner—Albert Decady
Assistant Examiner—Joseph D. Torres
(74) Attorney, Agent, or Firm—Christopher P. Maiorana, P.C.

(57) ABSTRACT

An apparatus comprising a first circuit and a second circuit. The first circuit generally comprises a first built in self test (BIST) circuit configured to test the first circuit. The second circuit generally comprises a second BIST circuit configured to test the second circuit. The second circuit may not be adjacent to the first circuit.

16 Claims, 3 Drawing Sheets

DISTRIBUTED TEST ARCHITECTURE FOR MULTIPORT RAMS OR OTHER CIRCUITRY

FIELD OF THE INVENTION

The present invention relates to a method and/or architecture for distributed testing of circuitry generally and, more particularly, to a method and/or architecture for a distributed memory built in self test for multiport RAMs.

BACKGROUND OF THE INVENTION

Conventional multiport RAMs require complex circuitry. The complex circuitry makes determining whether a circuit is defective and/or where the defect is located both difficult and time consuming. Conventional built in self-test (BIST) circuits reduce the time and effort required for determining defects, since the BIST circuits can run self tests. The results from the self test can be analyzed to determine if the circuit is causing a problem and, if so, where the problem might be occurring in the circuit. Conventional BIST circuits, due to standard interfaces and centralized circuitry, are suited for board level BIST code generation. Conventional BIST circuits have limited interfacing capabilities. Additionally, conventional BIST circuits are not implemented to generate BIST code for embedded memories.

Furthermore, conventional BIST circuits impact RAM access and maximum frequency of operation of memory BIST (MBIST) circuits. The MBIST circuits require complex circuit routing and have limited interface capabilities due to area constraints. Conventional BIST circuits implement a centralized MBIST control block, a centralized address generator and a centralized data generator. The centralized components require complex routing. Additionally, layout versus schematic verification for MBIST circuits can be difficult.

SUMMARY OF THE INVENTION

The present invention concerns an apparatus comprising a first circuit and a second circuit. The first circuit generally comprises a first built in self test (BIST) circuit configured to test the first circuit. The second circuit generally comprises a second BIST circuit configured to test the second circuit. The second circuit may not be adjacent to the first circuit.

The objects, features and advantages of the present invention include providing a method and/or architecture for implementing a built in self test circuit that may (i) be implemented in embedded memories, (ii) run a memory test without impacting RAM access time, (iii) require minimal circuit routing, (iv) reduce circuit complexity and size, (v) allow implementation of local BIST address generation logic, (vi) allow implementation of local BIST data generation logic, and/or (vii) allow implementation of local BIST comparator logic.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
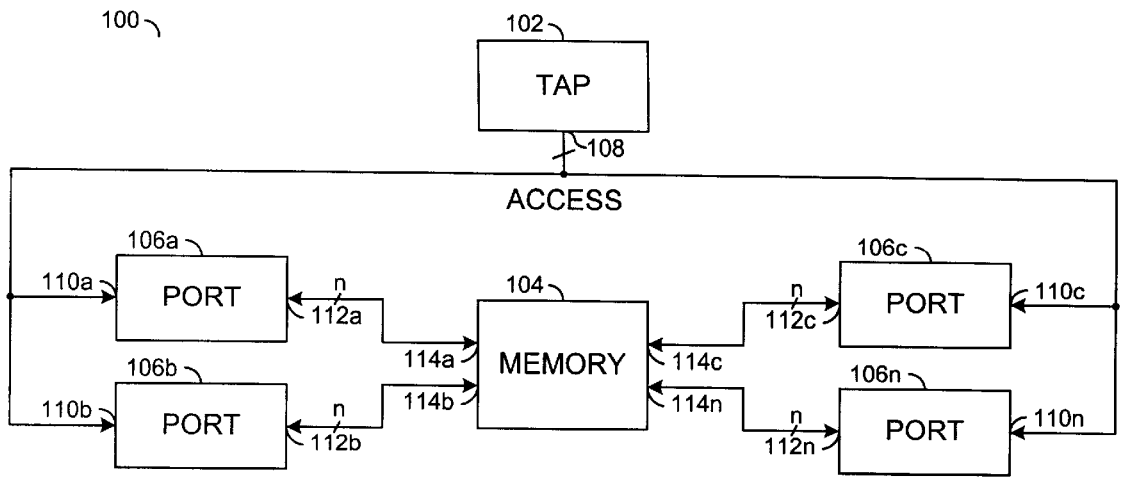
FIG. 1 is a block diagram of a preferred embodiment of the present invention.

Referring to FIG. 1, a block diagram of a circuit 100 is shown in accordance with a preferred embodiment of the present invention. The circuit 100 may implement distributed built in self test (BIST) circuitry. The circuit 100 may be implemented, in one example, as a memory with a built in self test (MBIST) circuit. The circuit 100 may allow, in one example, BIST code generation in embedded memories. In another example, the circuit 100 may allow BIST code generation in control circuitry. However, the circuit 100 may be implemented in other types of circuits in order to meet the criteria of a particular implementation. The circuit 100 may provide close proximity testing of circuitry (e.g., built in testing).

The structure of the circuit 100 generally comprises a test access port (TAP) block (or circuit) 102, a memory block (or circuit) 104 and a number of ports 106a–106n, where n is an integer. Each of the ports 106a–106n may be adjacent (e.g., independently implemented and/or controlled). The number of ports 106a–106n may be adjusted to meet the design criteria of a particular implementation. Each of the ports 106a–106n may simultaneously access the memory 104. Additionally, each of the ports 106a–106n may operate at a different frequency. The memory 104 may be implemented, in one example, as a random access memory (RAM). In one example, the circuit 100 may be embedded on a single chip.

The circuit 100 may be implemented with reduced complexity and size. The circuit 100 may be implemented to provide redundant data paths (e.g., more than one port). The redundant paths may be implemented to process comparisons of BIST results or expected data outputs. The circuit 100 may also be implemented as a shared memory fabric. For example, data may be read from one of the ports 106a–106n and routed to another (or the same) of the ports 106a–106n. The ports 106a–106n may operate at different data rates providing seamless interfacing between multiple clock domains.

The TAP block 102 may have an output 108 that may present a signal (e.g., ACCESS). The signal ACCESS may be implemented as an access bus signal. The signal ACCESS may control the testing of the memory 104. The signal ACCESS may respond, in one example, to an externally generated signal. In another example, the signal ACCESS may respond to an internal event. However, another appropriate type signal may be implemented in order to meet the criteria of a particular implementation. The signal ACCESS may be presented to a number of inputs 110a–110n (where n is an integer) of the ports 106a–106n. Each of the ports 106a–106n may also have an input/output 112a–112n (where n is an integer) that may be connected to an input/output 114a–114n (where n is an integer) of the memory 104. The particular number of input/outputs 112a–112n and 114a–114n may be adjusted to meet the design criteria of a particular implementation. In one example, the input/outputs 112a–112n and 114a–114n may be implemented as multi-bit input/outputs.

The circuit 100 may generate and compare BIST codes for (i) embedded memories or (ii) any other appropriate circuitry. By implementing test circuitry within each of the ports 106a–106n (to be described in more detail in connection with FIGS. 2–4), the circuit 100 may provide comparison of the BIST results and expected output values.

Additionally, the circuit 100 may run a memory test without impacting an access time of the memory 104. Specifically, full-speed tests and comparisons may be implemented.

Figure 2:
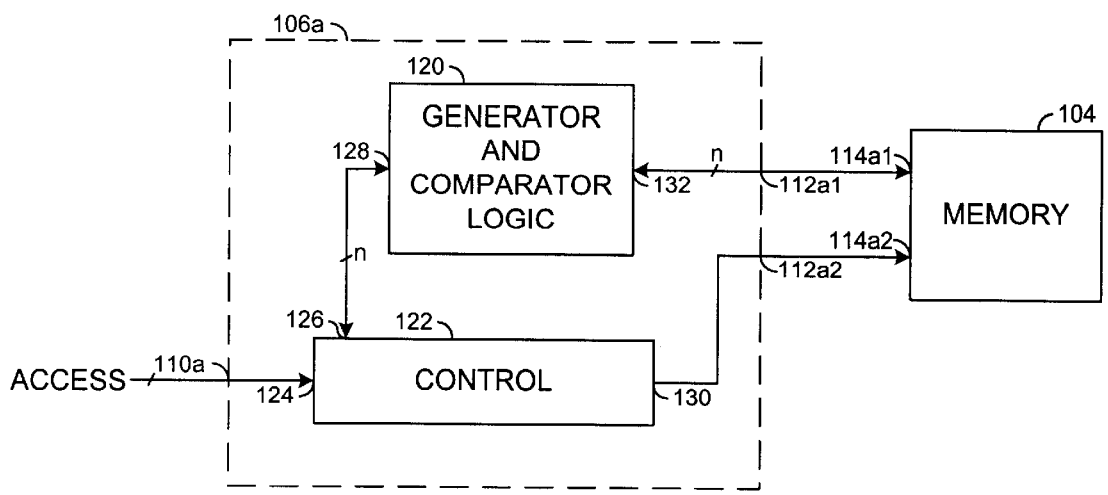
FIG. 2 is a detailed block diagram of a port of FIG. 1.

Referring to FIG. 2, a more detailed block diagram of the port 106a is shown. The ports 106b–106n may be similar to the port 106a. The port 106a generally comprises a generator and compare logic block (or circuit) 120 and a control block (or circuit) 122. In one example, the generation and compare logic block 120 may be implemented as a local BIST generator and compare logic block. In another example, the control block 122 may be implemented as a local BIST control circuit. The control circuit 122 may have an input 124 that may receive the signal ACCESS. The control circuit 122 may have an input/output 126 that may present a number of signals to an input/output 128 of the generator and compare logic block 120. Additionally, the control circuit 122 may have an output 130 that may present a signal to the output 112a2 of the port 106a. The generator and comparator logic circuit 120 may have an input/output 132 that may present a number of signals to the input/output 112a1 of the port 106a. The input/output 112a1 may be connected to the input/output 114a1 of the memory 104 and the output 112a2 may be connected to the input 114a2 of the memory 104.

Figure 3:
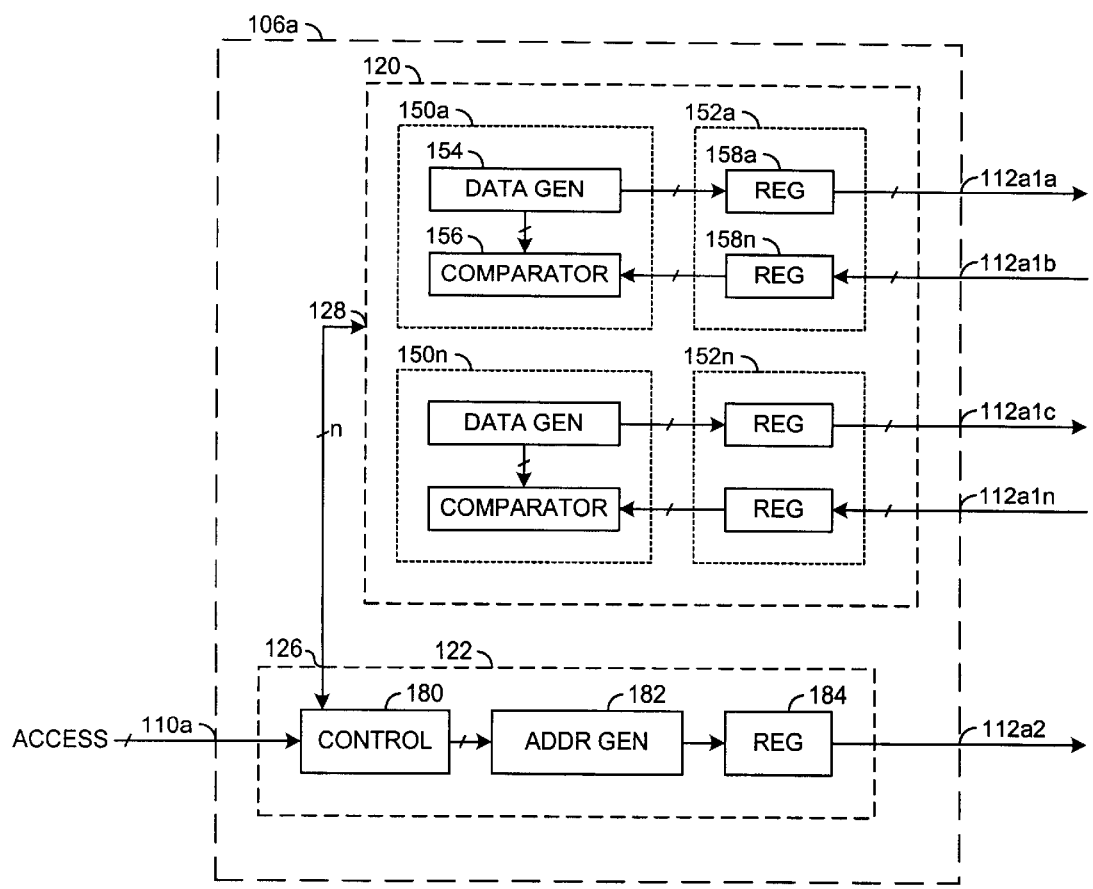
FIG. 3 is a more detailed block diagram of a port of FIGS. 1 and 2.

Referring to FIG. 3, a more detailed diagram of the port 106a is shown. The control circuit 122 may comprise a control circuit 180, an address generator circuit 182 and a register 184. In one example, the control block 122 may be implemented as a port specific BIST control circuit. In another example, the control circuit 180 may be implemented as a built in self test BIST circuit. The BIST control circuit 180 may receive the signal ACCESS. The BIST control circuit 180 may also present/receive the signals to/from the generation and comparator logic block 120 via input/output 126. The signal ACCESS may be implemented, in one example, as a multi-bit signal. In a particular example, for a quad-port RAM, the signal ACCESS may be implemented as a 4-bit signal. The particular bit width of the signal ACCESS may vary depending on a particular implementation of the BIST control circuit 180. The particular bit-width of the signal ACCESS does not necessarily vary as a function of the number of ports. However, in particular implementations, the number of bits of the signal ACCESS may match the number of ports.

The BIST control circuit 180 may present a signal to the address generation block 182. The address generation block 182 may be implemented, in one example, as a local BIST address generator. The address generation block 182 may present a signal to the register 184. The register 184 may present a signal to the output 112a2 of the port 106a.

The generator and comparator circuit 120 may comprise a number of local BIST circuits 150a–150n and a number of register blocks 152a–152n. In one example, the generator and comparator logic block 120 may be implemented as a port specific BIST data generation and comparison circuit.

Each of the local BIST circuits 150a–150n generally comprises a data generation block 154 and a comparator 156. In one example, the data generator block 154 may be implemented as a local BIST data generator block and the comparator 150 may be implemented as a local BIST comparator. The data generation block 154 and the comparator 156 may be connected. Each of the register blocks 152a–152n generally comprises a number of registers 158a–158n. The data generation block 154 may be configured to present a number of signals to the register 158a. The comparator 156 may be configured to receive one or more signals from the register 158n. The register 158n may be configured to receive the input 112a1b. The register 158n may be configured to present an output 112a1a. The register 152 may be configured to present an output 112a1c and receive an input 112a1n. The local BIST circuit 150n and the register block 152n may have similar components and/or operation to the local BIST circuit 150a and the register block 152a.

The circuit 100 may allow placement of the BIST address generation logic 182 next to a RAM address counter logic circuit (e.g., not shown, but part of the control circuit 122), placement of the BIST data generation logic 154 next to a data input register, placement of the MBIST comparator logic 156 next to a data output register and placement of the MBIST control logic 180 next to the BIST address generation logic 182.

Figure 4:
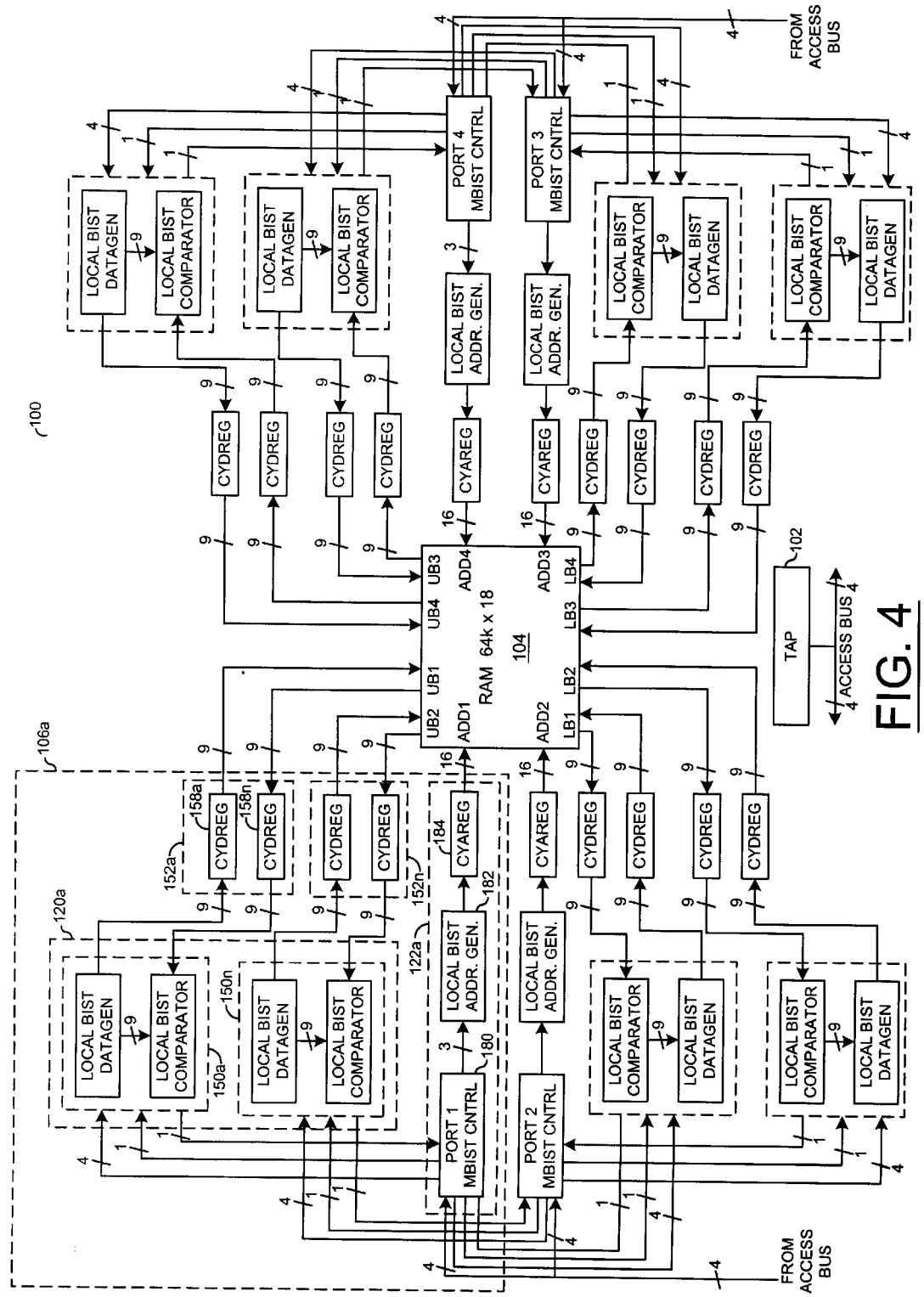
FIG. 4 is a detailed block diagram of an overview of the present invention.

Referring to FIG. 4, a detailed overview of the present invention is shown. The circuit 100 is shown implemented as a four port RAM with port specific MBIST circuits. The circuit 100 is shown with a minimum bit configuration. However, the circuit 100 may be implemented with other bit configurations in order to meet the criteria of a particular implementation.

The circuit 100 may be implemented in embedded memories or other applicable devices. In one example, the circuit 100 may run a memory test without impacting RAM access time. The circuit 100 may compare multiple BIST results. The circuit 100 may also compare the BIST results to expected values of tested circuits. The circuit 100 may provide reduce circuit complexity and size, while requiring minimal circuit routing. Additionally, the circuit 100 may allow implementation of (i) local address generation circuits (e.g., the address generator 182), (ii) local data generation circuitry (e.g., the data generators 154), (iii) local MBIST comparators (e.g., the comparators 156) and (iv) local MBIST controllers (e.g., the controllers 180).

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a first circuit comprising a first local built in self test (BIST) circuit configured to test a multi-port random access memory; and
    a second circuit comprising a second local BIST circuit configured to test said multi-port random access memory, wherein said first local BIST circuit and said second local BIST circuit (i) are each independently controlled and (ii) provide a redundant data path to said multi-port random access memory.

2. The apparatus according to claim 1, further comprising:
    a comparator configured to compare an output of said first and second local BIST circuits to an expected result.

3. The apparatus according to claim 1, wherein each of said first and second BIST circuits comprise (i) a generator and comparator circuit and (ii) a control circuit.

4. The apparatus according to claim 3, wherein each of (i) said generator and comparator circuits and (ii) said control circuits are further configured to interface with each other.

5. The apparatus according to claim 1, further comprising a plurality of circuits each comprising a BIST circuit.

6. An apparatus comprising:
    a random access memory; and
    a plurality of ports each configured to (i) access said random access memory, (ii) include a test circuit configured to test said memory and (iii) provide a redundant data path to said random access memory, wherein each of said test circuits in each of said ports includes (i) a local generator and compare circuit and (ii) a local control circuit.

7. The apparatus according to claim 6, wherein each of said test circuits further comprises a comparator configured to compare an output of each of said plurality of ports.

8. The apparatus according to claim 6, further comprising:
a test access port circuit configured to communicate with each of said plurality of ports.

9. The apparatus according to claim 6, wherein (i) said generator and comparator circuit comprises a port specific built in self test (BIST) generator and comparator logic circuit and (ii) said control circuit comprises a port specific memory built in self test (MBIST) circuit.

10. The apparatus according to claim 6, wherein (i) said generator and comparator circuit and (ii) said control circuit are further configured to interface with each other.

11. The apparatus according to claim 6, wherein said memory comprises a random access memory (RAM).

12. A method for performing tests comprising the steps of:
(A) testing a multi-port random access memory through a first local test circuit; and
(B) testing said multi-port random access memory through a second local test circuit, wherein said first local test circuit and said second local test circuit (i) are each independently controlled and (ii) provide a redundant data path to said multi-port random access memory.

13. A method according to claim 12, further comprising the step of:
(C) comparing an output of step (A) and step (B).

14. The method according to claim 12, further comprising the steps of:
(D) controlling accessing and testing of said memory through a test access port (TAP).

15. The method according to claim 12, wherein said first local test circuit is implemented in a first port of said memory and said second local test circuit is implemented in a second port of said memory.

16. The method according to claim 12, further comprising comparing an output of each of said first and second local test circuits.

* * * * *